United States Patent
Nam et al.

(10) Patent No.: US 10,020,465 B2
(45) Date of Patent: Jul. 10, 2018

(54) COMPOSITION FOR ENCAPSULATING ORGANIC LIGHT EMITTING DIODE DEVICE AND ORGANIC LIGHT EMITTING DIODE DISPLAY USING THE SAME

(71) Applicant: SAMSUNG SDI CO., LTD., Yongin-si, Gyeonggi-do (KR)

(72) Inventors: Seong Ryong Nam, Uiwang-si (KR); Ji Yeon Lee, Uiwang-si (KR); Kyoung Jin Ha, Uiwang-si (KR); Sung Min Ko, Uiwang-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 207 days.

(21) Appl. No.: 14/736,677

(22) Filed: Jun. 11, 2015

(65) Prior Publication Data

US 2015/0364690 A1   Dec. 17, 2015

(30) Foreign Application Priority Data

Jun. 12, 2014  (KR) .................. 10-2014-0071759

(51) Int. Cl.
| | |
|---|---|
| H01L 51/00 | (2006.01) |
| H01L 51/52 | (2006.01) |
| C09D 133/04 | (2006.01) |
| C09D 133/06 | (2006.01) |
| C08F 222/10 | (2006.01) |

(52) U.S. Cl.
CPC .... *H01L 51/5256* (2013.01); *C08F 222/1006* (2013.01); *C09D 133/04* (2013.01); *C09D 133/06* (2013.01); *C08F 2222/1026* (2013.01); *Y10T 428/1059* (2015.01); *Y10T 428/1077* (2015.01)

(58) Field of Classification Search
CPC ............ H01L 51/0043; H01L 51/0034; H01L 51/5246; H01L 51/5256; H01L 51/5296; H01B 3/447; C09D 135/02; C09D 133/04; C09D 133/06; C02F 222/1006; C02F 2222/1026; C09J 133/08; Y10T 428/1059; Y10T 428/1077; Y10T 428/1082
USPC .... 428/1.5, 1.54, 1.55, 34.1, 317, 1; 257/40, 257/E51.03; 438/99; 522/182
See application file for complete search history.

(56) References Cited

U.S. PATENT DOCUMENTS

2014/0329927 A1* 11/2014 Ha ..................... C09J 175/16
                                                           522/42

FOREIGN PATENT DOCUMENTS

| CN | 103227155 A | 7/2013 |
|---|---|---|
| CN | 103597622 A | 2/2014 |
| JP | 2008-149710 A | 7/2008 |

(Continued)

OTHER PUBLICATIONS

Office Action dated Jan. 24, 2017 in the corresponding Chinese Patent Application No. 201510320226.4.

*Primary Examiner* — Ruiyun Zhang
(74) *Attorney, Agent, or Firm* — Lee & Morse, P.C.

(57) ABSTRACT

A composition for encapsulating an organic light emitting diode device and an organic light emitting diode display, the composition including a di(meth)acrylate including an unsubstituted alkylene group, a tri(meth)acrylate including a substituted or unsubstituted alkylene group or a substituted or unsubstituted alkyl group, and a photo-initiator, wherein the composition for encapsulating the organic light emitting diode device has a chloride content of about 200 ppm or less.

14 Claims, 3 Drawing Sheets

(56) References Cited

FOREIGN PATENT DOCUMENTS

| | | | |
|---|---|---|---|
| JP | 2008149710 A * | 7/2008 | |
| JP | 2010-251117 A | 11/2010 | |
| KR | 10-2011-0071039 A | 6/2011 | |
| WO | WO 2013085132 A1 * | 6/2013 | ............ C09J 175/16 |

* cited by examiner

COMPOSITION FOR ENCAPSULATING ORGANIC LIGHT EMITTING DIODE DEVICE AND ORGANIC LIGHT EMITTING DIODE DISPLAY USING THE SAME

CROSS-REFERENCE TO RELATED APPLICATION

Korean Patent Application No. 10-2014-0071759, filed on Jun. 12, 2014, in the Korean Intellectual Property Office, and entitled: "Composition for Encapsulating Organic Light Emitting Diode Device and Organic Light Emitting Diode Display Using the Same," is incorporated by reference herein in its entirety.

BACKGROUND

1. Field

Embodiments relate to a composition for encapsulating the organic light emitting diode device and an organic light emitting diode display using the same.

2. Description of the Related Art

An organic light emitting diode (OLED) display is an apparatus to emit lights itself using electroluminescence, and includes an organic light emitting diode.

SUMMARY

Embodiments are directed to a composition for encapsulating the organic light emitting diode device and an organic light emitting diode display using the same.

The embodiments may be realized by providing a composition for encapsulating an organic light emitting diode device, the composition including a di(meth)acrylate including an unsubstituted alkylene group, a tri(meth)acrylate including a substituted or unsubstituted alkylene group or a substituted or unsubstituted alkyl group, and a photo-initiator, wherein the composition for encapsulating the organic light emitting diode device has a chloride content of about 200 ppm or less.

A film prepared from the composition may have a surface roughness Ra of about 2.0 nm or less after depositing at a pressure of 0.1 torr and at a temperature of 150° C.

A weight ratio of the tri(meth)acrylate to the di(meth)acrylate in the composition may be about 1:7 to about 1:20.

The composition may include about 70 wt % to about 95 wt % of the di(meth)acrylate, about 1 wt % to about 20 wt % of the tri(meth)acrylate, and about 0.1 wt % to about 10 wt % of the photo-initiator, based on a total weight of the composition.

The di(meth)acrylate may include about 30 ppm or less of chloride.

The di(meth)acrylate including an unsubstituted alkylene group may include a di(meth)acrylate having an unsubstituted $C_8$ to $C_{12}$ alkylene group.

The tri(meth)acrylate may include about 30 ppm or less of chloride.

The tri(meth)acrylate including a substituted or unsubstituted alkylene group or a substituted or unsubstituted alkyl group may include at least one selected from trimethylolpropane tri(meth)acrylate, pentaerythritol tri(meth)acrylate, glycerol tri(meth)acrylate, ethoxylated trimethylolpropane tri(meth)acrylate, and propoxylated trimethylolpropane tri(meth)acrylate.

The composition may further include a thermal stabilizer.

The composition may further include a mono(meth)acrylate having a boiling point of about 100° C. or more at a pressure of 0.1 torr.

The mono(meth)acrylate may include about 30 ppm or less of chloride.

The mono(meth)acrylate may include at least one selected from decyl (meth)acrylate, undecyl (meth)acrylate, lauryl (meth)acrylate, tridecyl (meth)acrylate, tetradecyl (meth)acrylate, pentadecyl (meth)acrylate, arachidyl (meth)acrylate, stearyl (meth)acrylate, cetyl (meth)acrylate, heptadecyl (meth)acrylate, nonadecyl (meth)acrylate, and phenylphenoxyethyl (meth)acrylate.

The composition may further include a thermal stabilizer.

The di(meth)acrylate may include a compound represented by the following Formula 1:

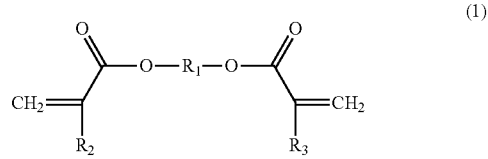

wherein, in Formula 1, $R_1$ may be an unsubstituted $C_1$ to $C_{20}$ alkylene group, and $R_2$ and $R_3$ may each independently be a hydrogen or a methyl group.

The di(meth)acrylate may include octanediol di(meth)acrylate, nonanediol di(meth)acrylate, decanediol di(meth)acrylate, undecanediol di(meth)acrylate, or dodecanediol di(meth)acrylate.

The di(meth)acrylate and the tri(meth)acrylate may each independently have a boiling point of about 100° C. or more at a pressure of about 0.1 torr.

The embodiments may be realized by providing an organic light emitting diode display including an organic light emitting diode device, and a barrier stack on the organic light emitting diode device, the barrier stack including an inorganic barrier layer and an organic barrier layer, wherein the organic barrier layer is prepared from the composition for encapsulating the organic light emitting diode device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
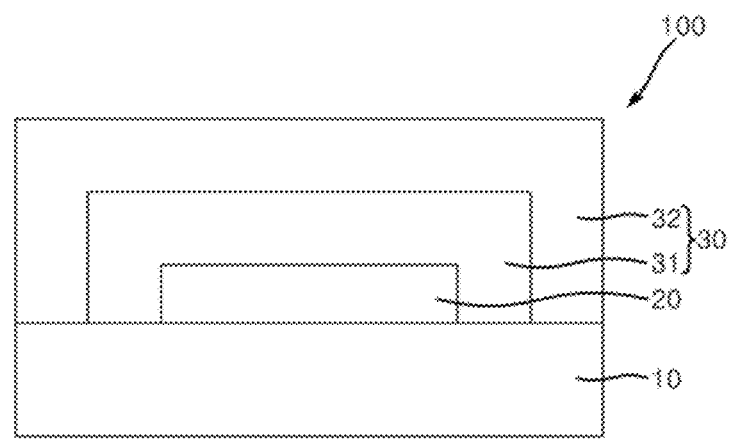
FIG. 1 illustrates a cross-sectional view of an organic light emitting diode display according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "(meth)acryl" collectively means both "acryl" and/or "methacryl."

As used herein, the term "substituted," unless otherwise stated, means that at least one hydrogen atom among functional groups is substituted with a hydroxyl group, a nitro group, a cyano group, an imino group (=NH, =NR, wherein, R is a $C_1$ to $C_{10}$ alkyl group), an amino group (—$NH_2$, —NH(R'), —N(R")(R'"), wherein, R', R" and R'" are each independently a $C_1$ to $C_{10}$ alkyl group), an amidino group, a hydrazine group, a hydrazone group, a carboxyl group, a $C_1$ to $C_{20}$ alkyl group, a $C_6$ to $C_{30}$ aryl group, a $C_3$ to $C_{30}$ cycloalkyl group, a $C_3$ to $C_{30}$ heteroaryl group, or a $C_2$ to $C_{30}$ heterocycloalkyl group.

Hereinafter, the composition for encapsulating the organic light emitting diode device according to an embodiment will be described in detail.

According to an embodiment, a composition for encapsulating the organic light emitting diode device may include, e.g., (A) a di(meth)acrylate having an unsubstituted alkylene group (hereinafter, (A) di(meth)acrylate), (B) a tri(meth) acrylate having a substituted or unsubstituted alkylene group or a substituted or unsubstituted alkyl group (hereinafter, (B) tri(meth)acrylate), and (D) a photo-initiator. The composition for encapsulating the organic light emitting diode device may have a chloride content of, e.g., about 200 ppm or less (based on a total amount of the composition).

The composition for encapsulating the organic light emitting diode device may be used with a metal component or stored in an apparatus installed with a metal component. Some compositions for encapsulating the organic light emitting diode device may lead to the corrosion of metal, and such compositions for encapsulating the organic light emitting diode device may have reduced efficiency.

In addition, the composition for encapsulating the organic light emitting diode device (e.g., a layer prepared from the composition) may be patterned through a mask or the like, which may be formed of a metal material. For example, if the mask were to corrode due to a composition for encapsulating the organic light emitting diode device, the composition or layer may not be patterned satisfactorily.

According to an embodiment, the composition for encapsulating the organic light emitting diode device may have a chloride (Cl) content of, e.g., about 200 ppm or less. The content of chloride may be measured by an ion chromatography method. Therefore, it is possible to reduce and/or prevent the corrosion of the mask and/or metal by the composition for encapsulating the organic light emitting diode device, to extend the storage periods of the encapsulating composition in the equipment, and to improve the efficiency of the encapsulating composition (e.g., improve efficiency of using the composition to prepare an encapsulating layer). Herein, the term "chloride (Cl)" collectively means "elemental chlorine", "neutral chloride atoms", "chlorine atom anion" and/or "chloride atoms as a substituent".

In an implementation, the composition for encapsulating the organic light emitting diode device may have a chloride content of about 0.1 ppm to about 180 ppm, e.g., about 10 ppm to about 150 ppm. Within this range, it is possible to increase an effect of preventing the corrosion of the metal, and thus form a pattern delicately.

The chloride in the encapsulating composition may refer to chloride as an impurity residing in a monomer leftover from the synthesis of the monomer. For example, the monomer may not include chloride in its chemical structure, but may include chloride as an impurity. Such a chloride atom ion may be generated from a chloride containing compound used as a raw material in the synthesis of the monomer. As a result, an encapsulating composition may include the chloride. Thus, the chloride may be an impurity in the form of, e.g., chlorine, a substituted form of chlorine or chloride, and/or a chloride ion.

The "metal" may include, e.g., a metal element, a transition element, or combinations thereof or alloys thereof. For example, the metal may include nickel, iron, copper, zinc, or alloys thereof.

In an implementation, the composition for encapsulating the organic light emitting diode device may include, e.g., the (A) di(meth)acrylate, the (B) tri(meth)acrylate, and the (D) photo-initiator. The (A) di(meth)acrylate and the (B) tri (meth)acrylate may be cured with the (D) photo-initiator to form an encapsulating layer (e.g., an organic barrier layer of the encapsulating layer).

The (A) di(meth)acrylate and the (B) tri(meth)acrylate may have higher boiling point than a typical mono(meth) acrylate. The (A) di(meth)acrylate and the (B) tri(meth) acrylate may have a boiling point of about 100° C. or more, e.g., from about 120° C. to about 200° C. at a pressure of about 0.1 torr, respectively. Within this range, the encapsulating composition may have low volatility after depositing. In this case, the organic barrier layer formed of or prepared from the encapsulating composition may have low surface roughness, e.g., on the deposited side. Furthermore, within this range, the encapsulating composition may include a number of photo-curable functional groups and may have excellent photo curing rate. The "0.1 torr" may be determined depending on the deposition conditions of the general organic material.

In an implementation, the encapsulating composition may have a surface roughness (Ra) of about 2.0 nm or less, e.g., from about 0.01 nm to about 2.0 nm after depositing (e.g., a layer prepared from the composition may exhibit the described surface roughness Ra). Within this range, the composition for encapsulating the organic light emitting diode device may form an even surface of the organic barrier layer. Thus, the organic barrier layer and/or the inorganic barrier layer formed on at least one side of the organic barrier layer may also be formed uniformly. As a result, the encapsulating composition according to an embodiment may help improve the reliability of the organic light emitting diode device.

In an implementation, the encapsulating composition according to an embodiment may have a photo curing rate of about 85% or more, e.g., from about 85% to about 99%. Within this range, the composition for encapsulating the organic light emitting diode device may have an effect of preventing, e.g., moisture, oxygen, or the like, from be transmitted therethrough. As a result, the encapsulating composition according to an embodiment may help improve the reliability of the organic light emitting diode device. The "deposition" refers to a deposition occurring at a pressure of 0.1 torr and a temperature of 150° C.

The (A) di(meth)acrylate may be a photo-curable monomer having two (meth)acrylate groups. The (A) di(meth)acrylate may be cured together with the (B) tri(meth)acrylate to form the organic barrier layer. The (A) di(meth)acrylate may have a viscosity at 25° C. of e.g., about 5 cps to 100 cps, and a molecular weight of, e.g., about 200 g/mol to about 1,000 g/mol. Within this range, the encapsulating composition may be suitably used to form the organic barrier layer.

The less chloride is present, the more excellent function the (A) di(meth)acrylate may exhibit. For example, the amount of the chloride in the di(meth)acrylate may be about 30 ppm or less. The (A) di(meth)acrylate may be present in an amount greater than the (B) tri(meth)acrylate and the (D) photo-initiator, in order to help improve curability of encapsulating composition and to facilitate the formation of the encapsulating layer by a deposition process. Within this range of chloride content, it is possible to reduce the chloride content to about 200 ppm or less in the total composition, even though the (A) di(meth)acrylate is present in higher amount. Thus, the encapsulating composition may have an effect of preventing the corrosion of the mask and/or metal.

The (A) di(meth)acrylate having the low chloride content (in the range described above) may be prepared from a (meth)acrylic acid or a methyl (meth)acrylate, instead of a (meth)acryloyl chloride used as a (meth)acryloyl group providing material, when preparing the di(meth)acrylate. In an implementation, the (A) di(meth)acrylate may be prepared from the di(meth)acrylate having an chloride content outside the range described above by purifying and removing the chloride. In an implementation, the (A) di(meth)acrylate having the chloride content of about 30 ppm or less may be prepared by adjusting a reaction temperature and/or other conditions.

The (A) di(meth)acrylate may include a di(meth)acrylate having an unsubstituted $C_1$ to $C_{20}$ alkylene group or an unsubstituted $C_1$ to $C_{20}$ alkyl group, e.g., an unsubstituted $C_1$ to $C_{20}$ alkylene group. It may be used alone or in combination of two or more thereof. In an implementation, the (A) di(meth)acrylate may be represented by Formula 1.

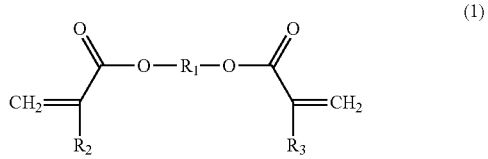

(1)

In an implementation, $R_1$ may be, e.g., an unsubstituted $C_1$ to $C_{20}$ alkylene group, and $R_2$ and $R_3$ may each independently be, e.g., a hydrogen or a methyl group.

In an implementation, $R_1$ may be, e.g., a unsubstituted $C_8$ to $C_{12}$ alkylene group. In an implementation, the (A) di(meth)acrylate may include, e.g., octanediol di(meth)acrylate, nonanediol di(meth)acrylate, decanediol di(meth)acrylate, undecanediol di(meth)acrylate, or dodecanediol di(meth)acrylate. In an implementation, the (A) di(meth)acrylate may be used alone or in combination of two or more thereof.

The (A) di(meth)acrylate may be present in the composition in an amount of about 70 wt % to about 95 wt %, e.g. about 85 wt % to about 94 wt % based on a total weight of the composition. Within this range, the encapsulating composition may have a suitable viscosity to facilitate the formation of the encapsulating layer of the organic light emitting diode device through a deposition process or the like.

The (B) tri(meth)acrylate may be a photo-curable monomer having three (meth)acrylate groups. The (B) tri(meth)acrylate may be cured together with the (A) di(meth)acrylate to form the organic barrier layer, and may help improve the crosslinking density after curing. The (B) tri(meth)acrylate may have a viscosity at 25° C. of, e.g., about 20 cps to about 500 cps, and a molecular weight of, e.g., about 200 g/mol to about 1,000 g/mol. Within this range, the encapsulating composition may facilitate the formation of the organic barrier layer.

The less chloride that is present, the more excellent function the (B) tri(meth)acrylate may exhibit. For example, chloride may be present in the tri(meth)acrylate in an amount of about 30 ppm or less. The (B) tri(meth)acrylate may be added in order to help improve curability of the encapsulating composition. Within this range of chloride content, the (B) tri(meth)acrylate may be adjusted such that the chloride content in the total composition is about 200 ppm or less. Thus, the encapsulating composition may have the increased effect of preventing the corrosion of the mask and/or metal.

The (B) tri(meth)acrylate having the low chloride content (in the range described above) may be prepared of or from a (meth)acrylic acid or a methyl (meth)acrylate, instead of a (meth)acryloyl chloride used as a (meth)acryloyl group providing material, when preparing the tri(meth)acrylate. In an implementation, the (B) tri(meth)acrylate may be prepared of or from a tri(meth)acrylate having an chloride content outside the range described above by purifying and removing the chloride. The (B) tri(meth)acrylate having the chloride content of about 30 ppm or less may be prepared by, e.g., adjusting a reaction temperature and/or other conditions.

The (B) tri(meth)acrylate may be a tri(meth)acrylate having a substituted or unsubstituted $C_1$ to $C_{20}$ alkylene group or a substituted or unsubstituted $C_1$ to $C_{20}$ alkyl group.

In an implementation, the (B) tri(meth)acrylate may include, e.g., trimethylolpropane tri(meth)acrylate, pentaerythritol tri(meth)acrylate, glycerol tri(meth)acrylate, ethoxylated trimethylolpropane tri(meth)acrylate, or propoxylated trimethylolpropane tri(meth)acrylate. The (B) tri(meth)acrylate may be used alone or in combination of two or more thereof.

The (B) tri(meth)acrylate may be present in the composition in an amount of about 1 wt % to about 20 wt %, e.g., about 1 wt % to about 10 wt % based on a total weight of the composition. Within this range, the (B) tri(meth)acrylate may be adjusted such that the encapsulating composition has a suitable viscosity. Therefore, it is possible to facilitate the formation of the encapsulating layer of the organic light emitting diode device through a deposition process or the like and to improve the curability of the encapsulating composition.

The (A) di(meth)acrylate and the (B) tri(meth)acrylate may be cured together to form the encapsulating layer of the organic light emitting diode device. The (B) tri(meth)acrylate may generally have a higher viscosity than that of the (A) di(meth)acrylate, and the contents of both components may be suitably adjusted in order to increase the curability and facilitate the deposition process. In an implementation, a weight ratio of the (B) tri(meth)acrylate to the (A) di(meth)acrylate in the encapsulating composition may be about 1:7 to about 1:20, e.g., about 1:7.5 to about 1:19. Within this range, it is possible to help increase the curability of the encapsulating composition and facilitate the deposition process. In an implementation, the encapsulating composition may include further (C) mono(meth)acrylate. In this case, a total amount of the (A) di(meth)acrylate and the (B) tri (meth)acrylate in the encapsulating composition (i.e., (A)+ (B)) may be about 95 wt % to about 99 wt % of the total amount of (A), (B) and (C) (i.e., (A)+(B)+(C)). Within this range, it is possible to help increase the curability of the encapsulating composition and facilitate the deposition process.

A (D) photo-initiator may facilitate or initiate the curing of the (A) di(meth)acrylate and the (B) tri(meth)acrylate to form the organic barrier layer. The (D) photo-initiator may include a suitable photo-curable initiator. In an implementation, the (D) photo-initiator may include, e.g., a triazine based initiator, an acetophenone based initiator, a benzophenone based initiator, a thioxanthone based initiator, a benzoin based initiator, a phosphorus based initiator, or an oxime based initiator. In an implementation, the phosphorus initiator may include diphenyl (2,4,6-trimethylbenzoyl) phosphine oxide, benzyl(diphenyl)phosphine oxide, or mixtures thereof.

The (D) photo-initiator may be present in lower amount than the amount of the (A) di(meth)acrylate and the (B) tri(meth)acrylate, and thus may have only a slight effect, if any, on the chloride content of the composition for encapsulating the organic light emitting diode device. In an implementation, the (D) photo-initiator may have an chloride content of about 10 ppm or less, e.g., about 0.01 ppm to about 10 ppm. A photo-initiator having the chloride content of about 10 ppm or less may be commercially available.

The (D) photo-initiator may be present in the composition in an amount of about 0.1 wt % to about 10 wt %, e.g., about 1 wt % to about 5 wt % based on a total weight of the composition. Within this range, the encapsulating composition may have increased curability. After curing, no initiator may remain, and the encapsulating layer may have increased light transmittance.

In an implementation, the encapsulating composition may include, e.g., about 70 wt % to about 95 wt % of the (A) di(meth)acrylate, about 1 wt % to about 20 wt % of the (B) tri(meth)acrylate, and about 0.1 wt % to about 10 wt % of (D) photo-initiator based on a total weight of the composition. In an implementation, the encapsulating composition may include, e.g., about 85 wt % to about 94 wt % of (A) di(meth)acrylate, 1 wt % to 10 wt % of (B) tri(meth)acrylate, and about 1 wt % to about 5 wt % of (D) photo-initiator based on a total weight of the composition. Within this range, the encapsulating composition may have an effect of reducing and/or preventing corrosion of the mask and/or metal, and may have high curability and low surface roughness after the curing process.

In an implementation, with a view toward ensuring that the chloride content is about 200 ppm or less in the composition for encapsulating the organic light emitting diode device, either the (A) di(meth)acrylate or the (B) tri(meth) acrylate (having extremely low chloride content) may be included in a high amount. In an implementation, the encapsulating composition may include, e.g., the (A) di(meth)acrylate having a chloride content of about 30 ppm or less, or the (B) tri(meth)acrylate having a chloride content of about 30 ppm or less, or combinations thereof.

In an implementation, the composition for encapsulating the organic light emitting diode device may further include (E) a thermal stabilizer.

The (E) thermal stabilizer may be present in the encapsulating composition to help prevent the change of viscosity at ambient or room temperature. The (E) thermal stabilizer may include a suitable thermal stabilizer. For example, the (E) thermal stabilizer may have a molecular weight of about 700 g/mol to about 1,000 g/mol. Within this range, as at least some of the encapsulating composition may not be deposited during a deposition process, it may be possible to prevent (e.g., premature) curing of the composition. In an implementation, the (E) thermal stabilizer may include, e.g., pentaerythritol tetrakis(3-(3,5-di-tert-butyl-4-hydroxyphenyl)propionate), stearyl-3,5-di-t-butyl-4-hydroxyphenylpropionate, pentaerythritol tetrakis 1,3,5-tris(2,6-dimethyl-3-hydroxy-4-t-butylbenzyl)isocyanurate, 1,3,5-tris(3,5-di-t-butyl-4-hydroxybenzyl)isocyanurate, or 1,3,5-tris(2-hydroxyethyl)isocyanurate-tris(3,5-di-t-butylhydroxyphenylpropionate).

The (E) thermal stabilizer may be present in a lower amount than the amount of the (A) di(meth)acrylate, the (B) tri(meth)acrylate and the (D) photo-initiator, and thus may have only a slight effect, if any, on the chloride content of the composition for encapsulating the organic light emitting diode device.

In an implementation, the (E) thermal stabilizer may be present in an amount of about 2,000 ppm or less, e.g., about 1 ppm to about 2,000 ppm or about 500 ppm to about 1,000 ppm, based on the total amount of the (A) di(meth)acrylate, the (B) tri(meth)acrylate, and the (D) photo-initiator (e.g., based on 1 million parts of (A), (B), (C), and/or (D)). Within this range, the (E) thermal stabilizer may help improve the storage stability of the encapsulating composition in a liquid phase and the processability of or during a deposition process.

In an implementation, the composition for encapsulating the organic light emitting diode device may have a viscosity of about 0 cps to about 200 cps, e.g., about 100 cps or less, about 5 cps to about 50 cps, about 5 cps to about 40 cps, or about 5 cps to about 30 cps, at 25±2° C. Within this range, the encapsulating composition may facilitate the formation of the organic barrier layer by deposition, ink jet printing, or the like.

The composition for encapsulating the organic light emitting diode device may be cured as a photo-curable composition, and may be subjected to UV curing by UV irradiation, e.g., at about 10 to about 500 mW/cm$^2$ for about 1 to about 100 seconds.

The composition for encapsulating the organic light emitting diode device may be used to encapsulate the organic light emitting diode device. For example, the organic barrier layer may be formed in an encapsulation structure in which the inorganic barrier layer and the organic barrier layer are sequentially formed. For example, the composition for encapsulating the organic light emitting diode device may form the organic barrier layer, e.g., by deposition, ink jet printing, screen printing, spin coating, blade coating, curing, or combinations thereof.

The composition for encapsulating the organic light emitting diode device may be used for encapsulating a member for a device, e.g., a member for display device, or a member for device subjected to degradation or deterioration by the transmission of gases or liquids from the surrounding environments, e.g., oxygen and/or moisture and/or water vapors in the atmosphere, and chemicals used in the process the electronic products. In an implementation, the member for device may be used in the encapsulating structure, e.g., such as a lighting device, a metal sensor pad, a micro disk laser, an electrochromic device, a photochromic device, a microelectromechanical system, a solar cell, an integrated circuit, a charge coupled device, a light emitting polymer, a light emitting diode device, or the like.

Hereinafter, the composition for encapsulating the organic light emitting diode device according to another embodiment will be described in detail.

According to the present embodiment, the composition for encapsulating the organic light emitting diode device may include, e.g., a (A) di(meth)acrylate, a (B) tri(meth)acrylate, a (D) photo-initiator, and a (C) mono(meth)acrylate having a boiling point of about 100° C. or more at a pressure of 0.1 torr (hereinafter, (C) mono(meth)acrylate). The composition may have a chloride content of about 200 ppm or less. As a result, it is possible to greatly reduce the surface roughness. The encapsulating composition according to the present embodiment may be substantially same as the encapsulating composition according to the previous embodiment, except that the composition further includes the (C) mono(meth)acrylate. Therefore, only the (C) mono(meth)acrylate now will be now described in detail.

The (C) mono(meth)acrylate may have one photo-curable functional group to help increase the curability thereof, and may have a boiling point of about 100° C. or more, e.g., from about 120° C. to about 200° C. at a pressure of 0.1 torr to help reduce the surface roughness of the deposited side of the encapsulating composition. In an implementation, the surface roughness (Ra) (e.g., of a layer prepared from the composition) may be about 2.0 nm or less, e.g., about 0.01 nm to about 2.0 nm, after a deposition and/or drying/curing process. In an implementation, a photo curing rate may be about 85% or more, e.g., about 85% to about 99%.

The less chloride that is present in the composition, the more excellent function the (C) mono(meth)acrylate may exhibit. For example, the chloride content in the mono(meth)acrylate may be about 30 ppm or less. Within this range of chloride content, the encapsulating composition may have the chloride content of about 200 ppm or less, and may exhibit an effect of reducing and/or preventing the corrosion of the mask and/or metal.

The (C) mono(meth)acrylate having the low chloride content (in the range described above) may be prepared of or from a (meth)acrylic acid or a methyl (meth)acrylate, instead of a (meth)acryloyl chloride used as a (meth)acryloyl group providing material, when preparing the mono(meth)acrylate. In an implementation, the (C) mono(meth)acrylate may be prepared from the mono(meth)acrylate having an chloride content outside the range described above by purifying and removing the chloride. The (C) mono(meth)acrylate having the chloride content of about 30 ppm or less may be prepared by adjusting the reaction temperature and other conditions.

The (C) mono(meth)acrylate may be a mono(meth)acrylate having a substituted or unsubstituted $C_{12}$ to $C_{20}$ alkyl group or a substituted or unsubstituted aryl group. In an implementation, the (C) mono(meth)acrylate may include, e.g., decyl (meth)acrylate, undecyl (meth)acrylate, lauryl (meth)acrylate, tridecyl (meth)acrylate, tetradecyl (meth)acrylate, pentadecyl (meth)acrylate, arachidyl (meth)acrylate, stearyl (meth)acrylate, cetyl (meth)acrylate, heptadecyl (meth)acrylate, nonadecyl (meth)acrylate, or phenylphenoxyethyl (meth)acrylate.

The (C) mono(meth)acrylate may be present in the composition in an amount of about 1 wt % to about 40 wt %, e.g., about 1 wt % to about 20 wt % or about 1 wt % to about 10 wt %, based on a total weight of the composition.

In an implementation, the encapsulating composition may include, e.g., about 70 wt % to about 95 wt % of the (A) di(meth)acrylate, about 1 wt % to about 20 wt % of the (B) tri(meth)acrylate, about 0.1 wt % to about 10 wt % of the (D) photo-initiator, and about 1 wt % to about 20 wt % of (C) mono(meth)acrylate, e.g., about 70 wt % to about 85 wt % of the (A) di(meth)acrylate, about 1 wt % to about 10 wt % of the (B) tri(meth)acrylate, about 1 wt % to about 5 wt % of the (D) photo-initiator, and about 1 wt % to about 10 wt % of the (C) mono(meth)acrylate based on a total weight of the composition. Within this range, the encapsulating composition may have an effect of reducing and/or preventing the corrosion of the mask and/or metal and may help reduce the surface roughness (e.g., of a layer prepared from the composition).

In an implementation, with a view toward keeping the chloride content at about 200 ppm or less in the composition for encapsulating the organic light emitting diode device, at least one of the (A) di(meth)acrylate, the (B) tri(meth)acrylate, or the (C) mono(meth)acrylate having extremely low chloride content may be used in high amount. In an implementation, the encapsulating compound may include, e.g., the (A) di(meth)acrylate having the chloride content of about 30 ppm or less, the (B) tri(meth)acrylate having the chloride content of about 30 ppm or less, or the (C) mono(meth)acrylate having the chloride content of about 30 ppm or less, or combinations thereof.

In an implementation, the encapsulating composition may further include a (E) thermal stabilizer.

The (E) thermal stabilizer may be the same as described above with respect to the previous embodiment.

In an implementation, the (E) thermal stabilizer may be present in the composition in an amount of about 2,000 ppm or less, e.g., about 1 ppm to about 2,000 ppm or about 500 ppm to about 1,000 ppm, based on the total amount of the (A) di(meth)acrylate, the (B) tri(meth)acrylate, the (C) mono(meth)acrylate, and the (D) photo-initiator. Within this range, the (E) thermal stabilizer may help improve the storage stability of the encapsulating composition in a liquid phase and the processability of a deposition process.

Hereinafter, an organic light emitting diode display according to an embodiment will be described in detail.

The organic light emitting diode display according to an embodiment may include an organic barrier layer prepared of or from the composition for encapsulating the organic light emitting diode of an embodiment. For example, the organic light emitting diode display may include an organic light emitting diode device and a barrier stack on the organic light emitting diode device. The barrier stack may include an inorganic barrier layer and an organic barrier layer, and the organic barrier layer may be prepared of or from the composition for encapsulating the organic light emitting diode device according to an embodiment. As a result, the organic light emitting diode display may have excellent reliability.

Now, an organic light emitting diode display according to an embodiment will be described referring to FIG. 1. FIG. 1 illustrates a cross-sectional view of an organic light emitting diode display according to an embodiment.

Referring to FIG. 1, an organic light emitting diode display 100 may include a substrate 10, an organic light emitting diode device 20 formed on the substrate 10, and a barrier stack 30 on the organic light emitting diode device 20 and including an inorganic barrier layer 31 and an organic barrier layer 32. The inorganic barrier layer 31 may be in contact with the organic light emitting diode device 20, and the organic barrier layer 32 may be prepared from the composition for encapsulating the organic light emitting diode device according to an embodiment.

The substrate 10 may include a suitable substrate provided that the organic light emitting diode device may be formed on the substrate, and may include, e.g., a transparent glass, plastic sheet, silicone or metal substrate, or the like.

The organic light emitting diode device 20 may be used in the organic light emitting diode display. The organic light emitting diode device 20 may include a first electrode, a second electrode, and an organic emitting layer between the first electrode and the second electrode, wherein the organic emitting layer may be a layer in which a hole injection layer, a hole transporting layer, an emitting layer, an electron transporting layer, an electron injection layer, without limitation, are laminated sequentially.

The barrier stack 30 may include the organic barrier layer and the inorganic barrier layer. The organic barrier layer and the inorganic barrier layer may be prepared from different components and may serve individually or together as the encapsulant of the organic light emitting diode device.

The inorganic barrier layer may have the different component from that of the organic barrier layer, and may complement the effect of the organic barrier layer. The inorganic barrier layer may be prepared of inorganic materials having excellent light transmittance and barrier properties against moisture and/or oxygen. For example, the inorganic barrier layer may include metals, non-metals, intermetallic compounds or alloys, non-intermetallic compounds or alloys, oxides of metals or non-metals, fluorides of metals or non-metals, nitrides of metals or non-metals, carbides of metals or non-metals, oxynitrides of metals or non-metals, borides of metals or non-metals, oxyborides of metals or non-metals, silicides of metals or non-metals, or combinations thereof. The metal or non-metal may include, e.g., silicon (Si), aluminum (Al), selenium (Se), zinc (Zn), antimony (Sb), indium (In), germanium (Ge), tin (Sn), bismuth (Bi), transition metal, lanthanide metal, or the like. In an implementation, the inorganic barrier layer may include, e.g., silicon oxide (SiOx), silicon nitride (SiNx), silicon oxynitride (SiOxNy), ZnSe, ZnO, $Sb_2O_3$, AlOx (including $Al_2O_3$ or the like), $In_2O_3$, or $SnO_2$.

The inorganic barrier layer may be deposited by, e.g., a plasma process, a vacuum process. For example, the inorganic barrier layer may be deposited by a sputtering, a chemical vapor deposition, a plasma chemical vapor deposition, an evaporation, a sublimation, an electron cyclotron resonance-plasma enhanced vapor deposition, or combinations thereof.

If the organic barrier layer is deposited alternately with the inorganic barrier layer, it is possible to help ensure the smoothness of the inorganic barrier layer, and to help reduce and/or prevent any defects the inorganic barrier layer from being transmitted or transferred to the other inorganic barrier layer.

The organic barrier layer may be prepared by deposition, ink jet printing, screen printing, spin coating, blade coating, curing, alone or in combination thereof, of the composition for encapsulating the organic light emitting diode device according to embodiments. For example, the composition for encapsulating the organic light emitting diode device may be applied to a thickness of about 1 μm to about 50 μm, and subjected to UV curing by UV irradiation at about 10 to about 500 mW/cm² for about 1 to about 100 seconds.

The barrier stack may include the organic barrier layer and the inorganic barrier layer, and a suitable total number of the organic barrier layer and the inorganic barrier layer may be included. The total number of the organic barrier layer and the inorganic barrier layer may depend on a level of the permeability resistance to oxygen, moisture, water vapor, and/or chemicals. In an implementation, the total number of the organic barrier layer and the inorganic barrier layer may be about 10 or less, e.g., about 2 to about 7. For example, seven layers in a structure as follows may be sequentially formed: the inorganic barrier layer/the organic barrier layer/the inorganic barrier layer/the organic barrier layer/the inorganic barrier layer/the organic barrier layer/the inorganic barrier layer.

The organic barrier layer and the inorganic barrier layer may be deposited alternately in the barrier stack and the physical properties of the composition may have a certain effect on the formed organic barrier layer. Thus, the organic barrier layer and the inorganic barrier layer may supplement or potentiate the effect on the device.

Figure 2:
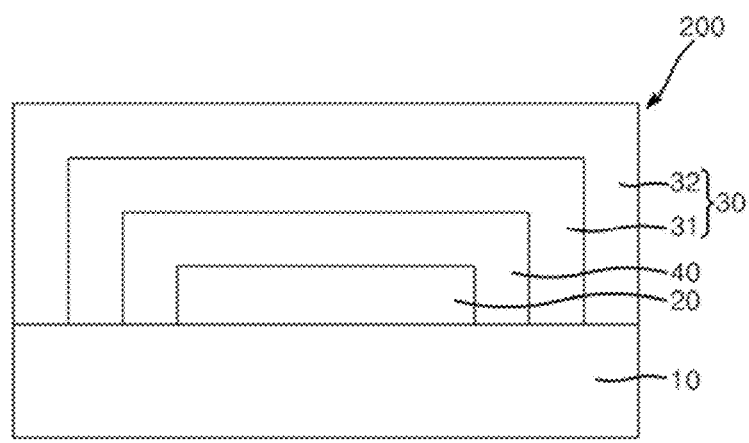
FIG. 2 illustrates a cross-sectional view of an organic light emitting diode display according to another embodiment.

Hereinafter, an organic light emitting diode display according to another embodiment will be described referring to FIG. 2. FIG. 2 illustrates a cross-sectional view of an organic light emitting diode display according to another embodiment.

Referring to FIG. 2, an organic light emitting diode display 200 according to the present embodiment may include a substrate 10, an organic light emitting diode device 20 on the substrate 10, and a barrier stack 30 on the organic light emitting diode device 20. The barrier stack may include an inorganic barrier layer 31 and an organic barrier layer 32. The inorganic barrier layer 31 may encapsulate an interior space 40 in which the organic light emitting diode device 20 is received or accommodated, and the organic barrier layer 32 may be prepared from the composition for encapsulating the organic light emitting diode. The organic light emitting diode display according to the present embodiment may be substantially same as those according to previous embodiment except that the inorganic barrier layer may not directly contact the organic light emitting diode device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

The components of the Examples and the Comparative Examples will be described in detail.

(A) Di(meth)acrylate: (A1) 1,12-dodecanediol dimethacrylate (ENF Technology Co., Ltd., chloride content <30 ppm) (A2) 1,10-decanediol dimethacrylate (Shin-Nakamura Chemical Co., Ltd., chloride content <30 ppm), (A3) 1,12-dodecanediol dimethacrylate (ENF Technology Co., Ltd., chloride content of 200 ppm to 1,500 ppm);

(B) Tri(meth)acrylate: (B1) trimethylolpropane triacrylate (Hannong Chemicals Inc., chloride content 200 ppm), (B2) trimethylolpropane trimethacrylate (Hannong Chemicals Inc., chloride content 50 ppm);

(C) Mono(meth)acrylate: (C1) stearyl acrylate (Aldrich, chloride content <30 ppm, boiling point of 145° C. at a pressure of 0.1 torr), (C2) lauryl acrylate (Aldrich, chloride content <30 ppm, boiling point of 78° C. at a pressure of 0.1 torr);

(D) Photo-initiator: Darocur TPO (BASF SE); and (E) Thermal stabilizer: IRGANOX 1010 (BASF SE).

*The chloride contents of (A), (B), and (C) were measured using a DX 500 ion chromatography system from DIONEX Corporation according to the following Experimental Method.

Example 1

To a 125 ml brownish polypropylene bottle, 90.9 parts by weight of (A1), 4.8 parts by weight of (B1), 4.3 parts by weight of (D), and 750 ppm of (E) were charged and mixed at ambient temperature using a shaker for about 3 hours to prepare an encapsulating composition (a viscosity of 14 cps at 25° C.).

Examples 2 to 8 and Comparative Examples 1 to 4

The encapsulating compositions were prepared by the same method as in Example 1 except that the type and/or content of (A), (B), (C), and (D) in Example 1 were changed into those in Table 1 (Unit: part by weight), and the content of (E) was changed into those in Table 1 (Unit: ppm).

TABLE 1

|   |    | Examples |      |      |      |      |      |      |      | Comparative Examples |      |      |      |
|---|----|------|------|------|------|------|------|------|------|------|------|------|------|
|   |    | 1    | 2    | 3    | 4    | 5    | 6    | 7    | 8    | 1    | 2    | 3    | 4    |
| A | A1 | 90.9 | 86.1 | 76.5 | —    | 86.1 | —    | 90.9 | 76.5 | —    | —    | —    | —    |
|   | A2 | —    | —    | —    | 90.9 | —    | 90.9 | —    | —    | —    | —    | —    | —    |
|   | A3 | —    | —    | —    | —    | —    | —    | —    | —    | 90.9 | 76.5 | 76.5 | 86.1 |
| B | B1 | 4.8  | 9.6  | 9.6  | 4.8  | —    | —    | 4.8  | 9.6  | 4.8  | 9.6  | 9.6  | —    |
|   | B2 | —    | —    | —    | —    | 9.6  | 4.8  | —    | —    | —    | —    | —    | —    |
| C | C1 | —    | —    | 9.6  | —    | —    | —    | —    | 9.6  | —    | 9.6  | —    | —    |
|   | C2 | —    | —    | —    | —    | —    | —    | —    | —    | —    | —    | 9.6  | 9.6  |
| D |    | 4.3  | 4.3  | 4.3  | 4.3  | 4.3  | 4.3  | 4.3  | 4.3  | 4.3  | 4.3  | 4.3  | 4.3  |
| E |    | 750  | 750  | 750  | 750  | 750  | 750  | —    | —    | 750  | 750  | 750  | 750  |

The compositions for encapsulating the organic light emitting diode in the Examples and Comparative Examples were evaluated for the physical properties in Table 2, and the results thereof are shown in FIGS. 3 to 6.

TABLE 2

|   | Examples |   |   |   |   |   |   |   | Comparative Examples |   |   |   |
|---|---|---|---|---|---|---|---|---|---|---|---|---|
|   | 1 | 2 | 3 | 4 | 5 | 6 | 7 | 8 | 1 | 2 | 3 | 4 |
| Cl content in composition (ppm) | 100 | 70 | 120 | 135 | 95 | 65 | 100 | 70 | 1,100 | 860 | 250 | 650 |
| Surface roughness (Ra, nm) | 0.75 | 1.02 | 1.22 | 0.88 | 1.10 | 1.45 | 0.75 | 1.22 | 1.01 | 1.45 | 4.98 | 3.54 |
| Initial corrosion (N°) | No | No | No | No | No | No | No | No | 25 | 40 | 85 | 42 |
| Light transmittance (%) | 98.0 | 97.1 | 98.2 | 97.5 | 97.6 | 97.2 | 98.0 | 98.2 | 97.9 | 98.1 | 94.8 | 93.9 |

Figure 3:
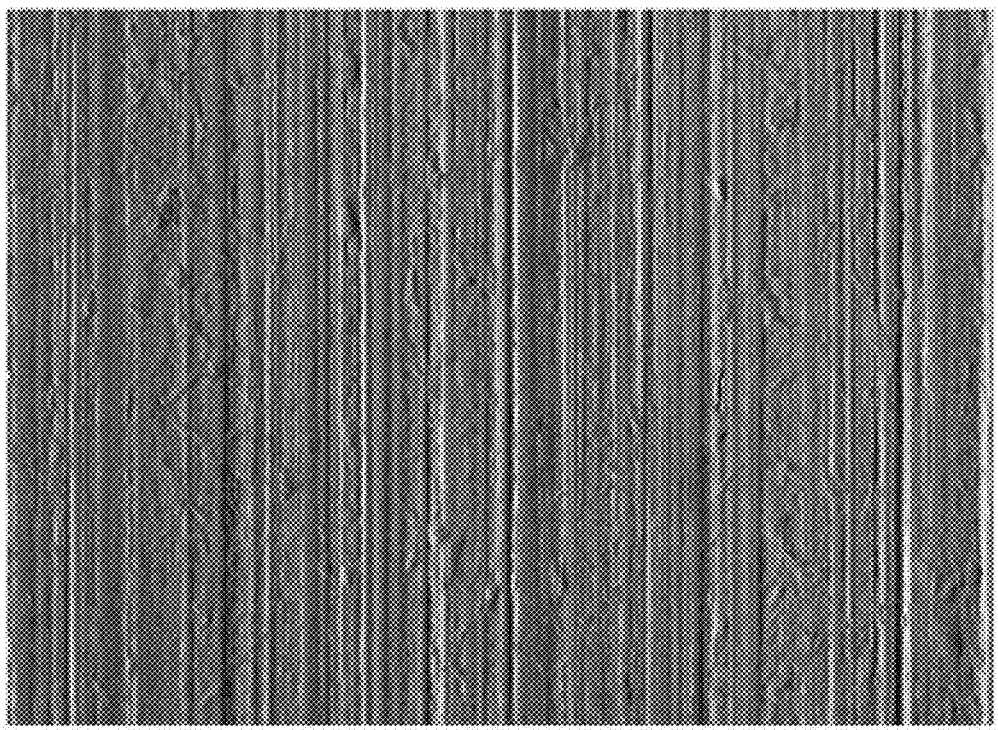
FIG. 3 illustrates a SEM image after a corrosion evaluation of the composition for encapsulating the organic light emitting diode device according to Example 1.

As shown in Table 1, it may be seen that the composition for encapsulating the organic light emitting diode device of the Examples had the chloride content of 200 ppm or less in the encapsulating composition, and did not lead to corrosion. Referring to FIG. 3, which shows a scanning electron microscope (SEM) image of a surface after the corrosion evaluation of Example 1, it may be seen that a piece of nickel-iron alloy had a smooth surface and did not lead to corrosion. Furthermore, referring to FIG. 5, which shows energy dispersive X-ray spectroscopy (EDS) result of the surface after the corrosion evaluation of Example 1, it may be seen that the composition did not include the chloride, in comparison with FIG. 6, in which it may be seen that the corrosion occurred due to the chloride.

In addition, the composition for encapsulating the organic light emitting diode device of the Examples had an effect of ensuring the reliability of the organic light emitting diode device by forming a uniform organic barrier layer having low surface roughness of the deposited side when deposited.

Figure 4:
FIG. 4 illustrates a SEM image of the corroded portion after the corrosion evaluation of the composition for encapsulating the organic light emitting diode device according to Comparative Example 1.

Meanwhile, it may be seen that the composition for encapsulating the organic light emitting diode device of the Comparative Examples had the chloride content of more than 200 ppm in the encapsulating composition, and led to the corrosion after running the curing 25 or more times. Referring to FIG. 4, which shows a result after the corrosion evaluation of Comparative Example 1, it may be seen that a piece of nickel-iron alloy had an uneven and corrugated surface, such as a crater formed usually as a portion of the surface melts and hardens. Furthermore, referring to FIG. 6, which shows an energy dispersive X-ray spectroscopy (EDS) result of the surface after the corrosion evaluation of Comparative Example 1, it may be seen that the composition included the chloride, and in comparison with FIG. 5, in which it may be seen that the corrosion occurred due to the chloride.

In addition, Comparative Examples 3 to 4 (including the component (C2) having a boiling point of less than 100° C. at a pressure of 0.1 torr) had high surface roughness, in comparison with the Examples.

(1) Composition and chloride content of each component: The composition for encapsulating the organic light emitting diode device was measured using a DX 500 ion chromatography system from DIONEX Corporation according to the combustion method.

Specifically, a combustion apparatus was an AQF-2100H (Mitsubishi Chemical Corporation), and an ion chromatography apparatus was IC-5000S (DIONEX).

Specifically, the combustion was carried out by sampling 1 to 50 mg of a specimen in 900 mg/kg $H_2O_2$ solution as an absorption solvent using an automatic sampler in a furnace at 950 to 1050° C.

In the ion chromatography apparatus, the working set was as follows: a column, IonPac AS19 (with Guard AG 19); an eluent, potassium hydroxide solution (10 mM eluted for 0 to 10 min, and 10 mM to 45 mM for 10 to 25 min); an eluent source, EGC KOH Cartridge; a flow rate, 1.0 ml/min; an injection volume, 100 μl; a detector, conductivity detector (range: 50 µS, Volt: 1 V); an automatic sampler, 1 to 50 mg of a specimen to be sampled; a suppressor, ASRS ultra II 4 mm; and an oven temperature, 30° C.

(2) Surface roughness: The composition for encapsulating the organic light emitting diode device was deposited and filmed (e.g., dried and/or cured) at a pressure of 0.1 torr and a temperature of 150° C., and was evaluated for the average value (Ra) of the surface roughness of the deposited side using a LS-AFM (AFM Probes). Lower Ra means the evenness of the deposited side.

(3) Occurrence of corrosion: The encapsulating composition was applied onto a piece of nickel-iron alloy for 1 second, and observed for the first cycle in which the piece of nickel-iron alloy start to corrode by performing and repeating a LED UV curing (a wavelength of 390 nm, 2-pass) while taking 2-pass as 1 cycle. A lower cycle number means that the metal corroded well.

Figure 5:
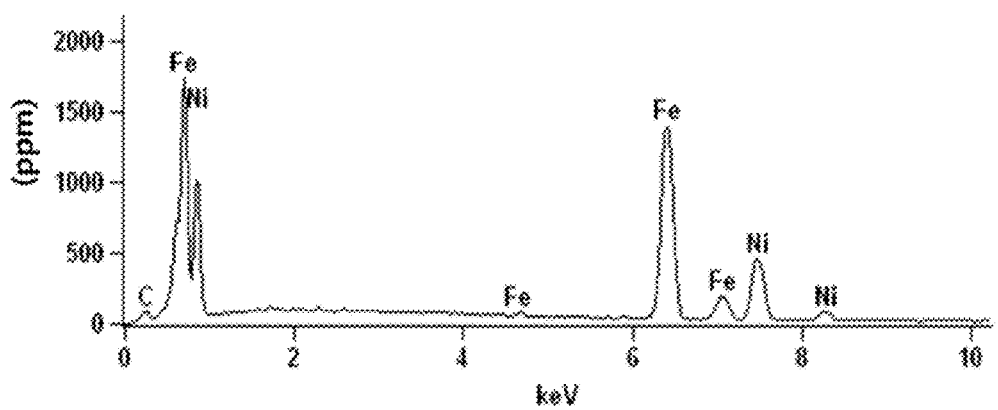
FIG. 5 illustrates an EDS result after the corrosion evaluation of the composition for encapsulating the organic light emitting diode device according to Example 1.
Figure 6:
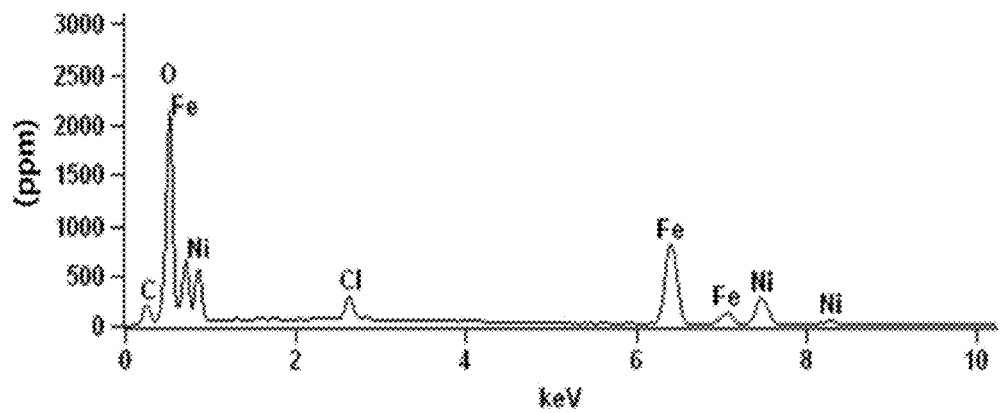
FIG. 6 illustrates an EDS result of the corroded portion after the corrosion evaluation of the composition for encapsulating the organic light emitting diode device according to Comparative Example 1.

FIG. 3 illustrates a SEM image of the surface of the piece of nickel-iron alloy after performing the LED UV curing of Example 1 30 times. FIG. 5 illustrates an EDS result of the surface of the piece of nickel-iron alloy after performing the LED UV curing of Example 1 30 times. FIG. 4 illustrates a SEM image of the surface of the piece of nickel-iron alloy after performing the LED UV curing of Comparative Example 1 30 times. FIG. 6 illustrates an EDS result of the surface of the piece of nickel-iron alloy after performing the LED UV curing of Comparative Example 1 30 times.

(4) Light transmittance: The encapsulating composition was UV cured under $N_2$ conditions to prepare a 10 µm thick film, and the film was evaluated for the light transmittance at a wavelength of 550 nm using a Lambda 950 (PerkinElmer, Inc.).

By way of summation and review, an organic light emitting diode may have deteriorated luminescent property when it contacts with moistures or oxygen flowing from outside. Thus, the organic light emitting diode may be encapsulated with an encapsulating composition. An encapsulant of the organic light emitting diode may include a multilayer structure alternately laminated with at least one of an organic barrier layer or an inorganic barrier layer.

A composition for encapsulating the organic light emitting diode may be used with metal components, or may be stored in an apparatus installed with a metal component. Some compositions for encapsulating the organic light emitting diode may lead to the corrosion of the metal due to chlorine or chloride that may be contained in the monomer. As a result, the composition for encapsulating the organic light emitting diode may have reduced efficiency. For example, the composition for encapsulating the organic light emitting diode may be patterned through a mask or the like, which may be formed of a typical metal material such as iron, nickel, or the like. Therefore, if the mask were to corrode due to the composition for encapsulating the organic light emitting diode, the composition may not be patterned satisfactorily and may have reduced sealing property. In addition, the surface of the organic barrier layer formed of or prepared from the composition for encapsulating the organic light emitting diode may be uneven due to the corrosion. Thus, the organic barrier layer and/or the inorganic barrier layer on the one side of the organic barrier layer may also be uneven. Thus, the organic light emitting diode may have reduced reliability. Moreover, the composition for encapsulating the organic light emitting diode may be used as the organic barrier layer only if it has high photo curing rate and light transmittance.

The embodiments may provide a composition for encapsulating the organic light emitting diode device that is capable of reducing and/or preventing the corrosion of a mask and a metal by controlling the content of chlorine or chloride.

The embodiments may provide a composition for encapsulating the organic light emitting diode device capable of forming an organic barrier layer having low surface roughness.

The embodiments may provide a composition for encapsulating the organic light emitting diode device having a high photo curing rate and high light transmittance after curing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for encapsulating an organic light emitting diode device, the composition comprising:
   a di(meth)acrylate including an unsubstituted alkylene group,
   a tri(meth)acrylate including a substituted or unsubstituted alkylene group or a substituted or unsubstituted alkyl group, and
   a photo-initiator,
   wherein the composition for encapsulating the organic light emitting diode device has a chloride content of about 200 ppm or less,
   wherein the composition includes:
      about 85 wt % to about 94 wt % of the di(meth)acrylate,
      about 1 wt % to about 10 wt % of the tri(meth)acrylate, and
      about 1 wt % to about 5 wt % of the photo-initiator, based on a total weight of the composition, and
   wherein the di(meth)acrylate includes about 30 ppm or less of chloride.

2. The composition for encapsulating the organic light emitting diode device as claimed in claim 1, wherein a film prepared from the composition has a surface roughness Ra of about 2.0 nm or less after depositing at a pressure of 0.1 torr and at a temperature of 150° C.

3. The composition for encapsulating the organic light emitting diode device as claimed in claim 1, wherein the di(meth)acrylate including an unsubstituted alkylene group includes a di(meth)acrylate having an unsubstituted $C_8$ to $C_{12}$ alkylene group.

4. The composition for encapsulating the organic light emitting diode device as claimed in claim 1, wherein the tri(meth)acrylate includes about 30 ppm or less of chloride.

5. The composition for encapsulating the organic light emitting diode device as claimed in claim 1, wherein the tri(meth)acrylate including a substituted or unsubstituted alkylene group or a substituted or unsubstituted alkyl group includes at least one selected from trimethylolpropane tri(meth)acrylate, pentaerythritol tri(meth)acrylate, glycerol tri(meth)acrylate, ethoxylated trimethylolpropane tri(meth)acrylate, and propoxylated trimethylolpropane tri(meth)acrylate.

6. The composition for encapsulating the organic light emitting diode device as claimed in claim 1, further comprising a thermal stabilizer.

7. The composition for encapsulating the organic light emitting diode device as claimed in claim 1, further comprising a mono(meth)acrylate having a boiling point of about 100° C. or more at a pressure of 0.1 torr.

8. The composition for encapsulating the organic light emitting diode device as claimed in claim 7, wherein the mono(meth)acrylate includes about 30 ppm or less of chloride.

9. The composition for encapsulating the organic light emitting diode device as claimed in claim 7, wherein the mono(meth)acrylate includes at least one selected from decyl (meth)acrylate, undecyl (meth)acrylate, lauryl (meth)acrylate, tridecyl (meth)acrylate, tetradecyl (meth)acrylate, pentadecyl (meth)acrylate, arachidyl (meth)acrylate, stearyl (meth)acrylate, cetyl (meth)acrylate, heptadecyl (meth)acrylate, nonadecyl (meth)acrylate, and phenylphenoxyethyl (meth)acrylate.

10. The composition for encapsulating the organic light emitting diode device as claimed in claim 7, further comprising a thermal stabilizer.

11. The composition for encapsulating the organic light emitting diode device as claimed in claim 1, wherein the di(meth)acrylate includes a compound represented by the following Formula 1:

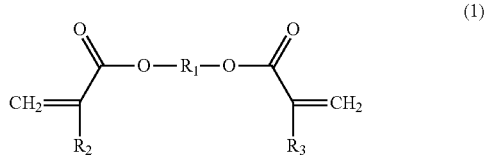

(1)

wherein, in Formula 1, $R_1$ is an unsubstituted $C_1$ to $C_{20}$ alkylene group, and $R_2$ and $R_3$ are each independently a hydrogen or a methyl group.

12. The composition for encapsulating the organic light emitting diode device as claimed in claim 1, wherein the di(meth)acrylate includes octanediol di(meth)acrylate, nonanediol di(meth)acrylate, decanediol di(meth)acrylate, undecanediol di(meth)acrylate, or dodecanediol di(meth)acrylate.

13. The composition for encapsulating the organic light emitting diode device as claimed in claim 1, wherein the di(meth)acrylate and the tri(meth)acrylate each independently have a boiling point of about 100° C. or more at a pressure of about 0.1 torr.

14. An organic light emitting diode display, comprising:

an organic light emitting diode device, and a barrier stack on the organic light emitting diode device, the barrier stack including an inorganic barrier layer and an organic barrier layer, wherein the organic barrier layer is prepared from the composition for encapsulating the organic light emitting diode device as claimed in claim 1.

* * * * *